(12) United States Patent
Gauthier, Jr. et al.

(10) Patent No.: US 7,767,539 B2
(45) Date of Patent: Aug. 3, 2010

(54) METHOD OF FABRICATING PATTERNED SOI DEVICES AND THE RESULTING DEVICE STRUCTURES

(75) Inventors: Robert J. Gauthier, Jr., Hinesburg, VT (US); Rajendran Krishnasamy, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 146 days.

(21) Appl. No.: 11/949,973

(22) Filed: Dec. 4, 2007

(65) Prior Publication Data

US 2009/0140338 A1    Jun. 4, 2009

(51) Int. Cl.
*H01L 21/762*    (2006.01)

(52) U.S. Cl. .............. 438/423; 438/149; 438/154; 438/197; 257/E21.561

(58) Field of Classification Search ............. 257/350, 257/351, E21.561, E21.564; 438/149, 154, 438/197, 423
See application file for complete search history.

(56) References Cited

U.S. PATENT DOCUMENTS

| | | | |
|---|---|---|---|
| 6,492,246 B1 * | 12/2002 | Cho et al. | 438/430 |
| 2003/0104681 A1 * | 6/2003 | Davari et al. | 438/480 |
| 2004/0253793 A1 * | 12/2004 | Sasaki et al. | 438/404 |
| 2006/0231892 A1 * | 10/2006 | Furukawa et al. | 257/347 |
| 2007/0269957 A1 * | 11/2007 | Cha et al. | 438/423 |

\* cited by examiner

*Primary Examiner*—Victor A Mandala
*Assistant Examiner*—Scott Stowe
(74) *Attorney, Agent, or Firm*—Edward W. Brown

(57) ABSTRACT

A method and resulting structure for fabricating a FET transistor for an integrated circuit on a silicon oxide (SOI) substrate comprising the steps of forming recesses in a substrate on both sides of a gate on the substrate, implanting oxygen ions into the recesses, and annealing the substrate to convert the oxygen ions into a SOI layer below each recess.

8 Claims, 5 Drawing Sheets

US 7,767,539 B2

METHOD OF FABRICATING PATTERNED SOI DEVICES AND THE RESULTING DEVICE STRUCTURES

FIELD OF THE INVENTION

The present invention relates to the fabrication and structure of semiconductor devices on silicon-on-insulator (SOI) substrates and, more particularly, to a method of forming a SOI layer in a Si-containing substrate, such as a Complementary Metal-Oxide-Semiconductor Field-Effect-Transistors (CMOS) starting wafer.

BACKGROUND OF THE INVENTION

One prior art method for fabricating SOI wafers is known as Separation by Implantation of Oxygen (SIMOX). This method typically involves using high-energy ions to implant a large dose of oxygen ions beneath the surface of a bulk Si-containing wafer, which unfortunately produces damage, such as dislocation loops, in the wafer. To control the final SOI thickness, it is necessary to Chem/Mech Polish (CMP). In addition, to achieve a perfect reliable Buried Oxide (BOX) along with SOI thickness, the following conditions must be met: 1) a high oxygen dose is necessary with uniform constant concentration to achieve uniform BOX thickness, which causes more damage, such as bigger dislocation loops, a contamination of the wafer because oxygen implantation introduces carbon and heavy metals, and also higher cost; 2) a high annealing temperature for a lengthy time produces better quality BOX, but it requires longer tool use and thus higher cost of the annealing tool (Lower temperature annealing is not able to remove the implantation damage totally and forms non-uniform oxide thickness, and the wafer results in larger dislocation loops and leakage at later steps in the integrated process); and 3) the cost of the BOX is proportional to both the oxygen implantation energy and dose and longer high temperature annealing, but higher energy causes deeper damage and more scattering of oxygen so that the desired depth/thickness of BOX as well as SOI is harder to control and creates higher production costs.

Another prior art method involves a wafer delaminating technique along with implantation. A beamline-type implanter by SOItech or a plasma immersion implantation chamber by Silicon Genesis is used. In both the SIMOX and SOITech/Silicon Genesis approaches, the entire wafer is formed with buried oxide, which eliminates the advantages and flexibility of fabricating a patterned SOI wafer having both BOX and bulk devices on the same wafer and chip.

All known prior art methods do not have the capability to fabricate both SOI and bulk devices on the same starting wafer, but are limited to SOI devices on SOI wafers or bulk devices on bulk wafers.

Current high performance technologies, such as CMOS, include embedded strained regions of, for example, eSiGe in pFET (compressive strain/stress for hole mobility enhancements) and, for example, eSiC in nFET (tensile strain/stress for electron mobility enhancements), preferably by a low to high temperature epitaxy process, after first forming recesses in a substrate. These embedded strained regions, which are in the substrate on either side of the channel region, are generally aligned to the gate of the FET and are doped in the same manner as the regular source/drain regions of the FETs. The embedded strained regions in the recesses function mainly to create a respective stress/strain (compressive strain/stress for pFETS and tensile strain/stress for nFETs) in the channel to increase carrier mobilities. This technology is not only applicable for strained layers but is also applicable for non-strained layers by growing epitaxy silicon in the silicon recesses.

SUMMARY OF THE INVENTION

Accordingly, the primary object of the present invention is to be able to fabricate a patterned SOI wafer with at least one BOX in the wafer.

A further object of the present invention is to be able to fabricate an SOI wafer with only a small implant dose of oxygen compared to that required by SIMOX.

A further object of the present invention is to provide a patterned SOI wafer with multiple silicon regions so that different devices can be integrated on the same wafer having both bulk and SOI devices on the same wafer for various applications, such as digital and analog.

Another object of the present invention is to be able to remove the small damage caused in the wafer by the implantation of oxygen ions.

An additional object of the present invention is to provide a fabrication process which permits greater control over the BOX and SOI thicknesses in the wafer.

These and other objects and features of the present invention are accomplished by performing oxygen implantation into the existing recesses in the silicon, which are created for high performance strained SiGe and SiC devices, to essentially eliminate silicon damage and its impact on the performance of the devices and, preferably, laser annealing for a shorter time than SIMOX before forming the embedded strained region in the recesses, thereby allowing for a lower energy for the implantation and a shorter time and higher temperance for the anneal. In addition, the present inventive method, in permitting lower oxygen ion energy and dose implantation and a lower laser anneal time, reduces the overall cost of fabrication and results in uniform BOX and SOI thickness.

BRIEF DESCRIPTION OF THE DRAWINGS

These and further features of the present invention will be apparent with reference to the following description and drawings of FIGS. 1-15 of the method of the present invention, which is described relative to CMOS device and wherein.

In the following detailed description, it will be understood that for simplicity and clarity of illustration, elements shown in the figures have not been drawn to scale. In addition, where considered appropriate, reference numbers have been repeated among the figures to indicate corresponding elements. Further, it will be understood that the foregoing description and the following description of the present invention are exemplary and are not restrictive of the invention

DETAILED DESCRIPTION OF THE INVENTION

A present fabrication process and semiconductor transistor device structure are known for FETs, such as pFETs (PMOS), nFETs (NMOS) and CMOS with enhanced transistor performance due to reduced stress/strain relaxation from the damage accumulations by creating recesses in the substrate and deposing, in the recesses embedded strained SiGe (eSiGe) for PMOS and embedded strained SiC (eSiC) for NMOS layers or films in the source/drain region.

Figure 1:
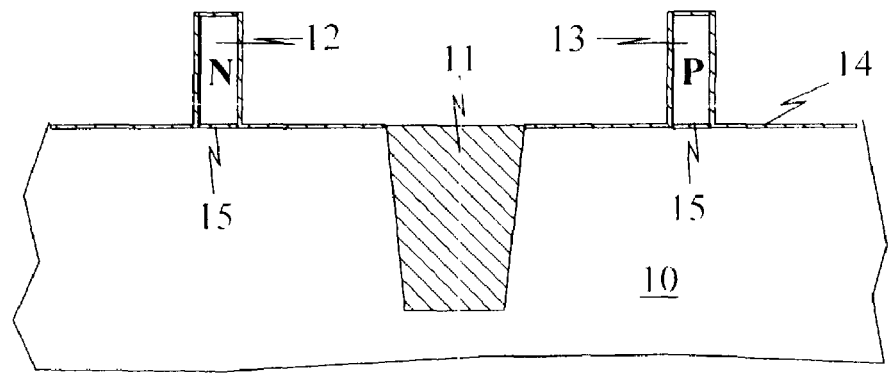
FIG. 1 is a cross-sectional view of a portion of a substrate of a semiconductor wafer with a n-type gate and a p-type gate disposed thereon and separated by a recessed isolation trench and having an oxide layer.
Figure 2:
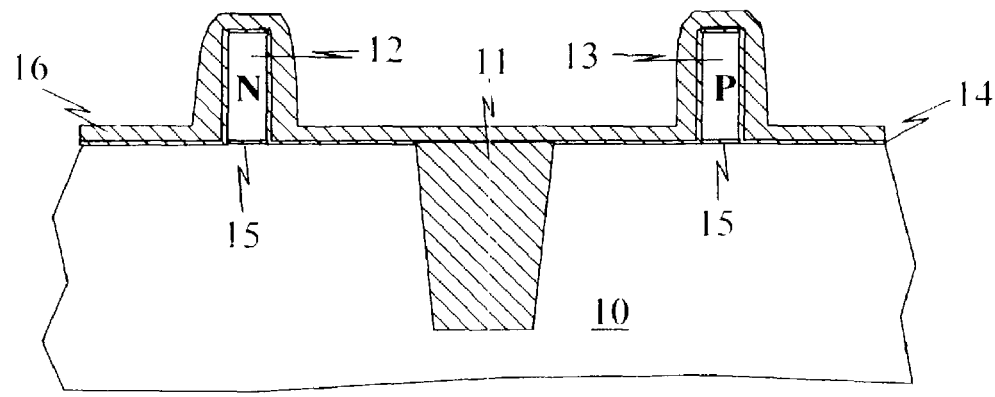
FIG. 2 is a cross-sectional view of the invention with the substrate of FIG. 1 having an insulating layer disposed on the oxide layer.
Figure 3:
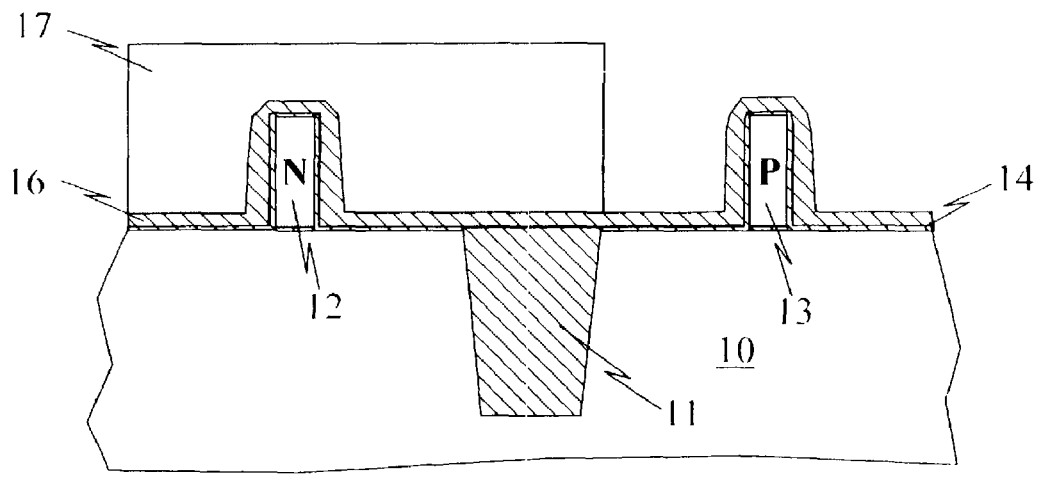
FIG. 3 is a cross-sectional view with the substrate of FIG. 2 having a resist mask covering the n-type gate.
Figure 4:
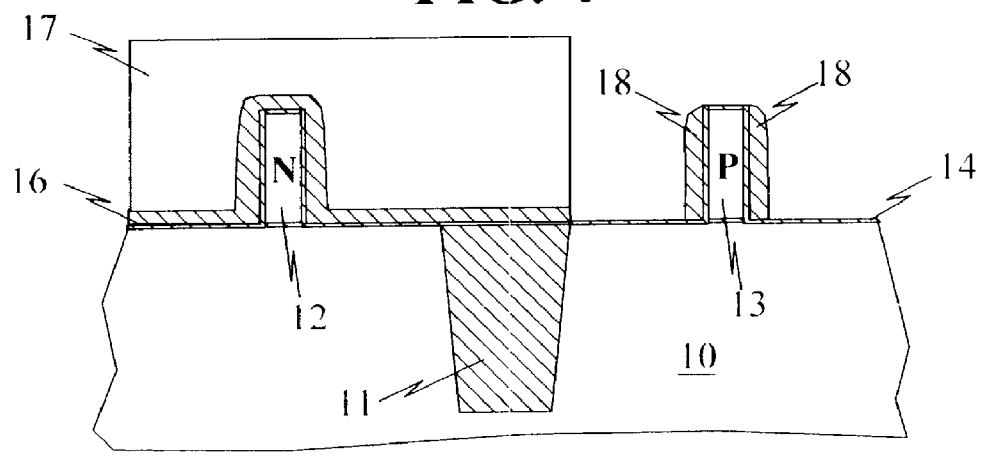
FIG. 4 is a cross-sectional view of the substrate of FIG. 3 having the insulating layer partially removed on the oxide surface on the substrate surface and the top of the p-type gate.
Figure 5:
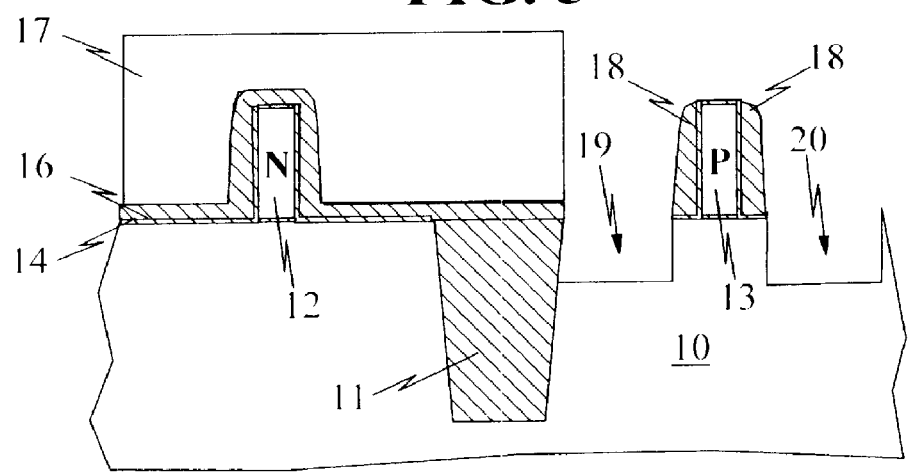
FIG. 5 is a cross-sectional view of the substrate of FIG. 4 with the oxide layer removed on the substrate surface and the top of the p-type gate and with recesses etched out of the substrate on both sides of the p-type gate.

In accordance with the present invention, the recesses, which would e normally formed for the eSiGe and eSiC layers or films, as described above, provide access to the interior of the substrate for creating SOI layers. To describe this novel SOI method and resulting structure, a CMOS device will be used as the vehicle for the description, although it will recognized that the method is broadly applicable to FETs and other devices. As shown in FIG. 1 is a portion of a substrate 10, herein silicon, having a recessed insulating isolation trench 11, as is well known in the art, and having formed thereon a n-type gate 12 and a p-type gate 13 of preferable polysilicon. The surface of the substrate 10 is formed with a thin insulating layer 14, preferably by oxidizing the substrate surface. The portion of the silicon oxide layer 14 over the channel (not shown) and under the gates serves as the gate oxide 15. To provide initial protection to the n-type gate 12 and to serve as a spacer 16 for both the gates 12 and 13, the walls of the gates also are coated with the disposable, conformal insulating layer 16, as shown in FIG. 2. Herein, the disposable insulating layer 16 is silicon nitride, which preferably is deposited by low pressure deposition. Next, as shown in FIG. 3, the n-type gate 12 is coated with a resist material 17, as is well known in the art, to mask the gate 12 for further processing of the p-type gate 13. In FIG. 4, the disposable layer 16 is removed from the top and partially from the walls of the p-gate to leave spacers 18. The unmasked area on the surface of the substrate surface 10 is etched by directional or anisotropic etching, preferably reactive ion etching with a commercially available etchant gas for etching herein silicon nitride. Next, recesses 19 and 20, as shown in FIG. 5, are preferably reactive ion etched into the substrate 10 on both sides of the p-type gate 13 and through the oxide layer 14 on the surface. The depth of the silicon recesses 19 and 20 range from 50 nm to 200 nm.

Figure 6:
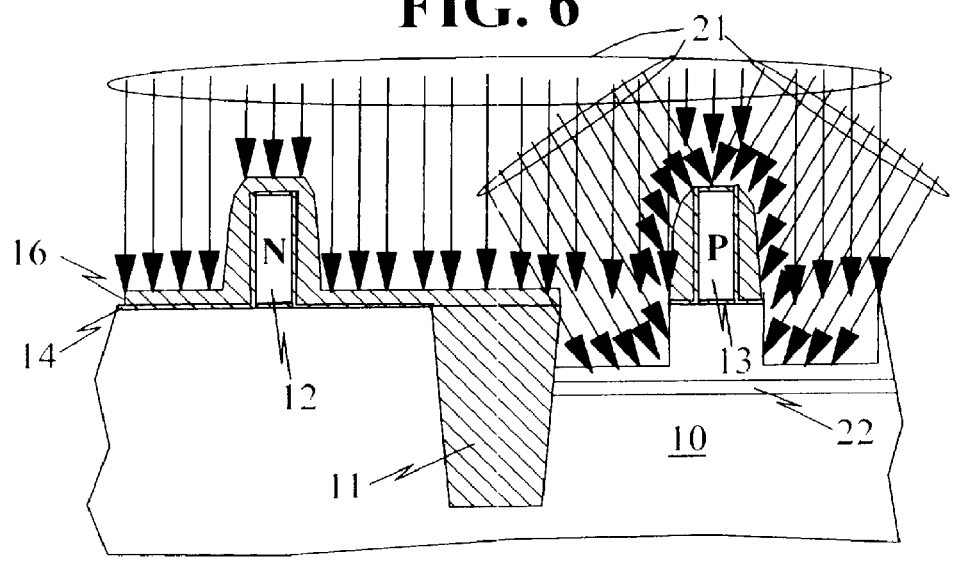
FIG. 6 is a cross-sectional view of the substrate of FIG. 5 having oxygen implanted into the recesses on both sides of the p-type gate to form a layer of oxygen in the substrate below the bottoms of the recesses.
Figure 7:
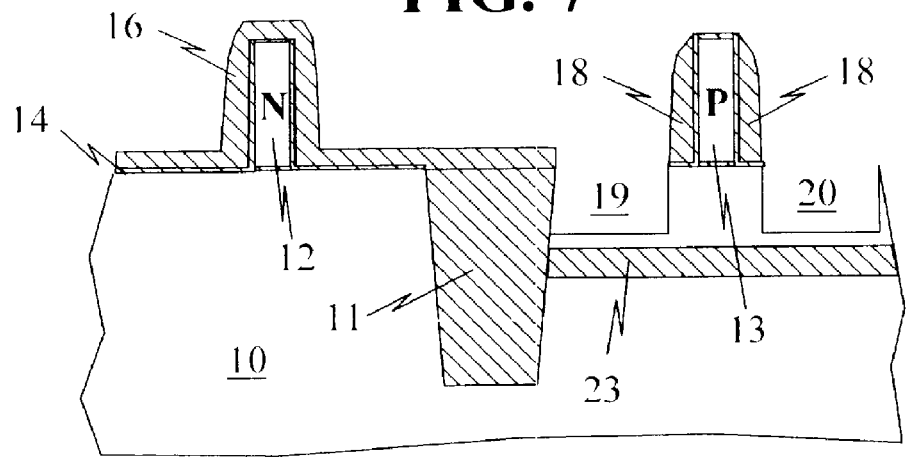
FIG. 7 is a cross-sectional view of the substrate of FIG. 6 being annealed to convert the oxygen layer of FIG. 6 into a thicker silicon oxide layer below the bottoms of the recesses and around the channel so as to include the channel.

Now, in accordance with the present invention, oxygen is implanted, as shown by the arrows 21, through the recesses 19 and 20 into the interior of the herein silicon substrate 10 to form an oxygen seed layer 22, as shown in FIG. 6, the resist layer 18 having been removed. The insulating layer, herein silicon nitride, blocks oxygen implantation in the n-type gate 12 area. To obtain a continuous and uniform layer in the interior of the substrate, the implantation is performed at tilt angles and with rotation. After implantation, the p-type gate area is laser annealed (not shown) to convert the oxygen seed layer 22 to an SOI layer 23 as shown in FIG. 7. Preferably, the annealing temperature ranges from 1200° C. to 1350° C. for a time ranging from 1 to 10 seconds. To obtain an SOI of approximately 100 Å-500 Å, in thickness, the annealing temperature and time should be about 1250° C. to 1350° C. for about 10 seconds.

The advantages of the present invention, by implanting oxygen ions at a lower dose and lower energy through the recesses in the silicon wafer and laser annealing, is that essentially no damage occurs in the silicon. In the prior art method, the BOX or SOI are formed by implanting the oxygen ions through the silicon wafer at very high energy and dosage which damages the silicon such that it affects device performance by causing leakage currents, higher off-currents and lower on-currents as examples.

Figure 8:
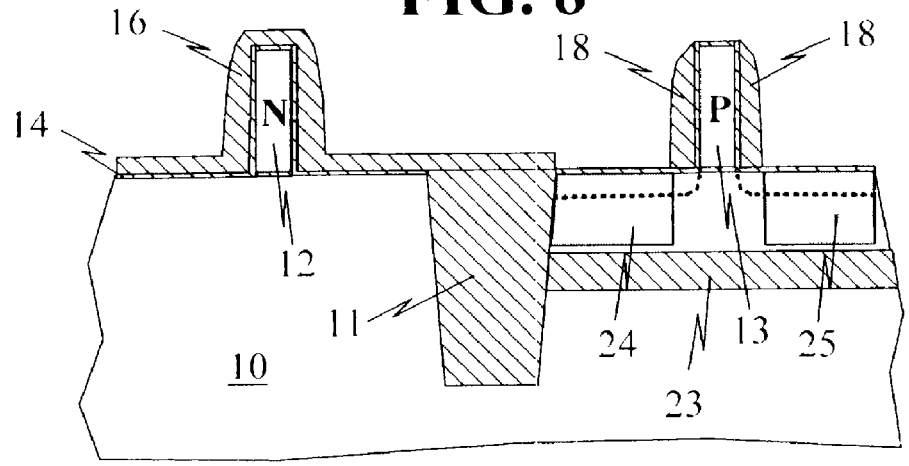
FIG. 8 is a cross-sectional view of the substrate of FIG. 7 having embedded strained layers (i.e.—eSiGe) formed in the recesses by growing the layers using a low to high temperature epitaxy process along with in-situ doping (i.e.—boron or indium) to form a source and a drain on opposite sides of the p-type gate.

Now, embedded strained alloy layers 24 and 25, preferably eSiGe, are herein epitaxially deposited in the recesses, as shown in FIG. 8. During the deposition, the thickness of the SOI layer 23 increases in thickness as shown by comparison of FIGS. 7 and 8. Embedded layers 24 and 25 are selectively epitaxially grown in the silicon recesses, as shown in FIG. 8, with in-situ doping for the source 26 and drain 27 with preferably boron (B), indium (In) or a combination thereof, as also shown in FIG. 8.

With the p-FET of the CMOS fabricated in accordance with the present invention, the n-FET portion of the CMOS will be fabricated as first shown in FIGS. 1 and 2. The n-type gate 12, again preferably polysilicon, is disposed on the substrate 10, herein silicon, with a thin insulating layer 14, such as by oxidization. The portion of the silicon oxide layer 14 over channel (not shown) and under the gate 12 serves as the gate oxide 15. As shown in FIG. 2, disposable insulating layer 16 of, herein silicon nitride, is disposed on the oxide layer 14.

Figure 9:
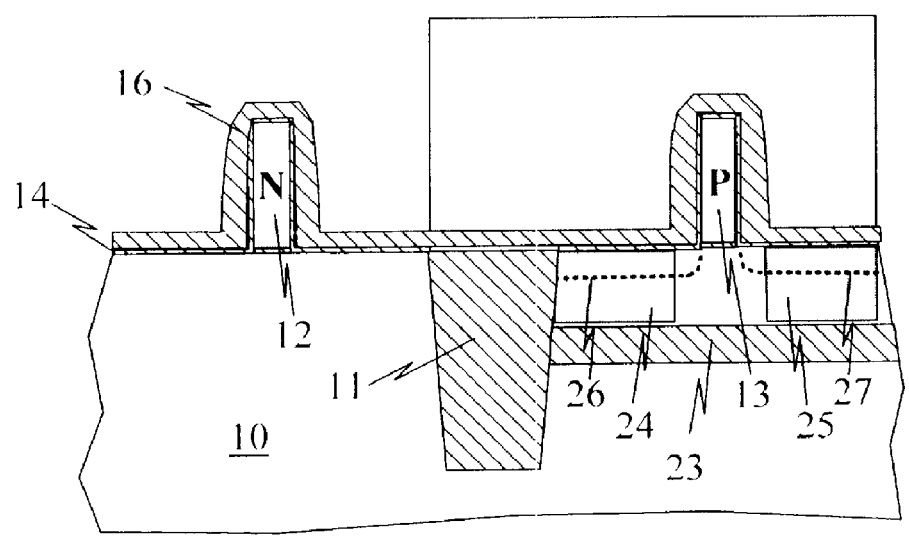
FIG. 9 is a cross-sectional view of the substrate of FIG. 8 showing an oxide layer and an insulating layer thereon on the surface of the p-type gate portion of the substrate along with a resist material on the insulating layer.
Figure 10:
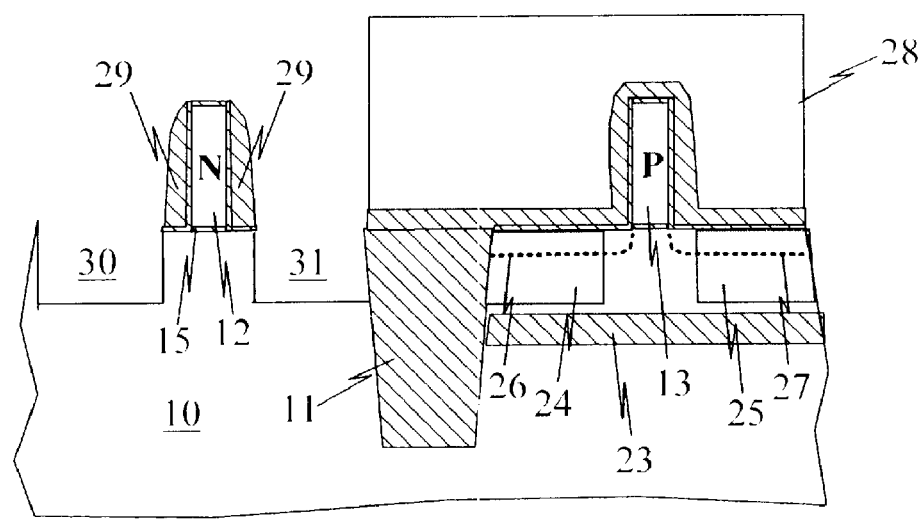
FIG. 10 is a cross-sectional view of the substrate of FIG. 9 with the oxide and insulating layers removed on the substrate surface and the top of the n-type gate and with recesses etched out of the substrate on both sides of the n-type gate.

Turning now to FIG. 9, a resist material 28, as is well known in the art, is deposited on the p-FET gate 13 to mask the p-type gate and surrounding area for further processing of the n-type gate. As shown in FIG. 10, the disposable layer 16 and the thin oxide layer 14 on the surface of the substrate 10 are removed by preferably reactive ion etching with the appropriate etchants as known in the art. The silicon nitride layer 17 on the vertical walls of the n-gate is reduced but not totally removed and will serve as spacers 29 during subsequent processing. Similar to the p-FET portion, recesses 30 and 31, as shown in FIG. 10, are formed in the substrate by anisotropic etching, such as reactive ion etching.

Figure 11:
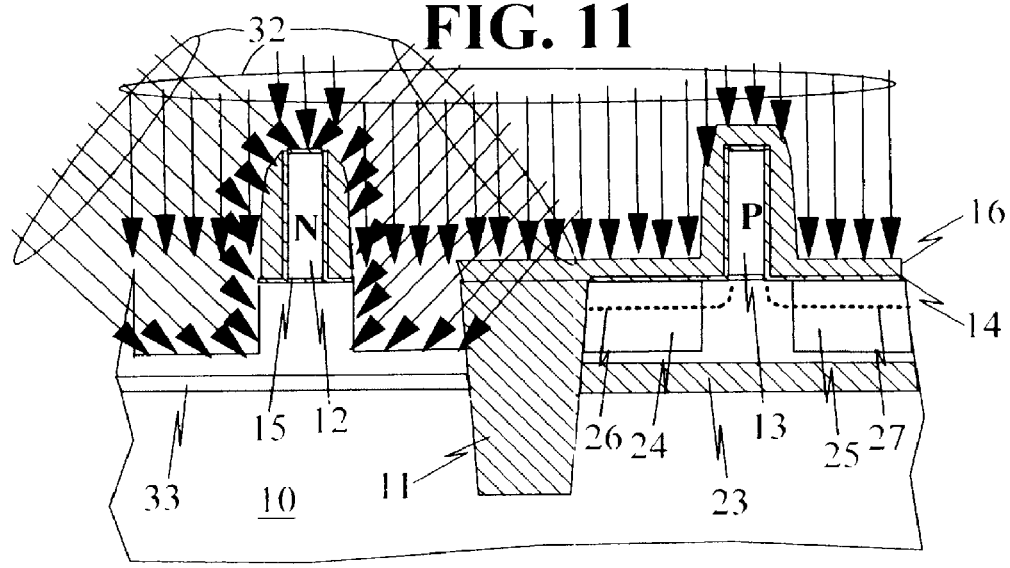
FIG. 11 is a cross-sectional view of the substrate of FIG. 10 having oxygen implanted into the recesses on both sides of the n-type gate to form a layer of oxygen in the substrate below the bottoms of the recesses.
Figure 12:
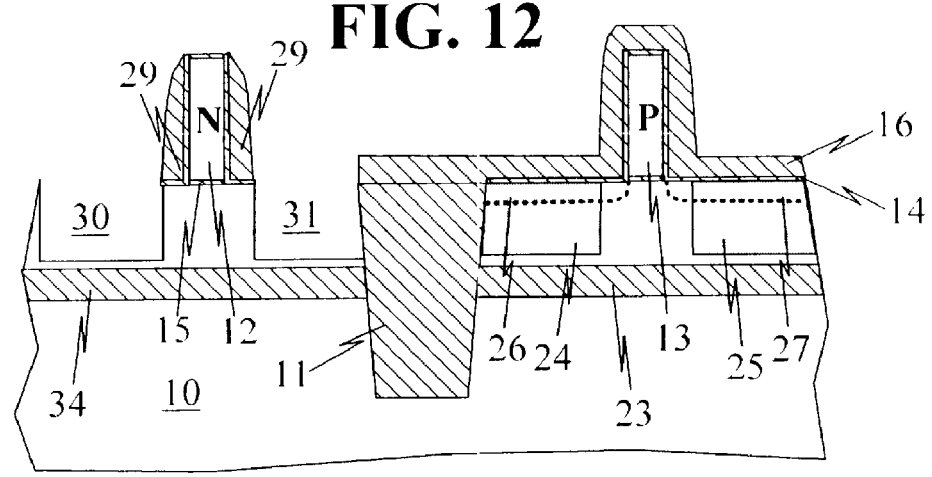
FIG. 12 is a cross-sectional view of the substrate of FIG. 11 annealed to convert the oxygen layer of FIG. 11 into a thicker silicon oxide layer below the bottoms of the recesses.

Again, in accordance with the present invention, instead of next forming embedded strained regions in the recesses 30 and 31, as normally practiced, oxygen is implanted, as shown by the arrows 32, through the recesses 30 and 31 into the interior of the herein silicon substrate 10 to form an oxygen seed layer 33, as shown in FIG. 11. The resist material 28 has been removed and the insulating layer 17, herein silicon nitride, blocks oxygen implantation in the n-type gate 13 area. Again, to obtain a continuous and uniform layer in the interior of the substrate, the implantation is performed at tilt angles and with rotation. After implantation, the n-type gate area is laser annealed (not shown) to convert the oxygen seed layer 33 to an SOI layer 34 as shown in FIG. 12. Preferably, the annealing temperature ranges from 1200° C. to 1350° C. for a time ranging from 1 to 10 seconds, which results in a BOX thickness in the range of about 200 Å to about 1000 Å.

Figure 13:
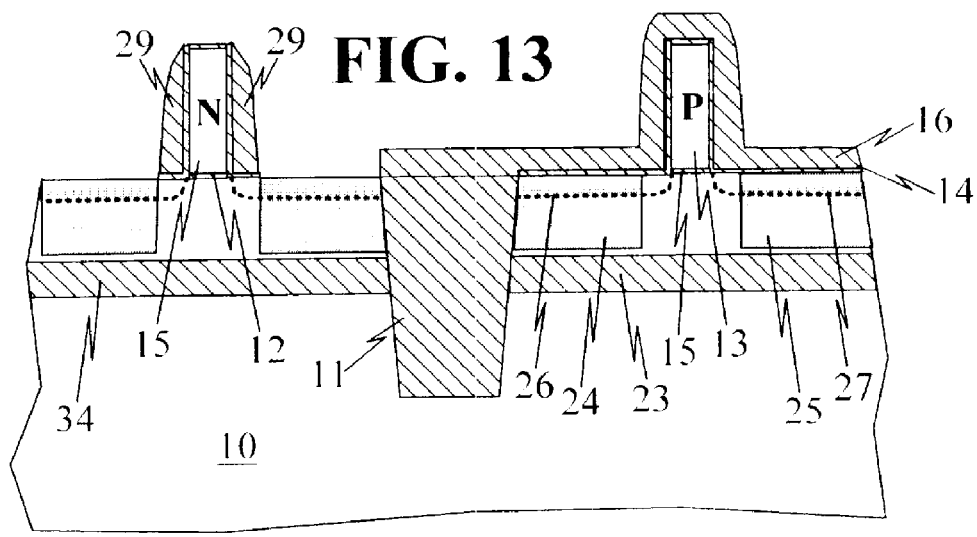
FIG. 13 is a cross-sectional view of the substrate of FIG. 11 having embedded strained layers (i.e.—eSiC) being formed herein by growing the layers using a low to high temperature epitaxy process along with in-situ doping (i.e.—arsenic, phosphorus, antimony or the combination thereof) to form a source and a drain on opposite sides of the n-type gate.
Figure 14:
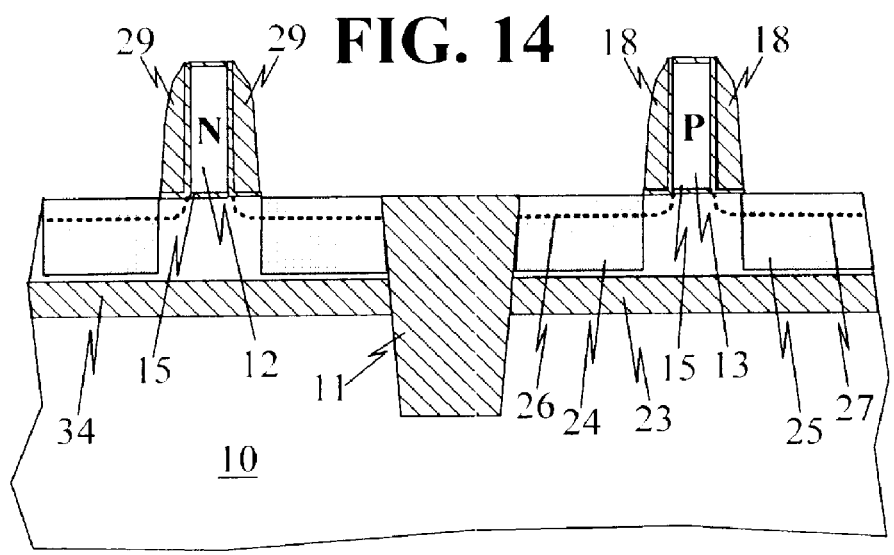
FIG. 14 is a cross-sectional view of the substrate of FIG. 13 showing the oxide and insulating layers removed from the p-type gate and silicon on insulator (SOI) under both the p-type and n-type gates.

Now, embedded strained alloy layers, 35 and 36 preferably eSiC, are herein epitaxially deposited in the recesses, as shown in FIG. 13. During the deposition, the thickness of the SOI layer 34 increases in thickness as shown by comparison of FIGS. 12 and 13. Preferably, the recesses are filled by low to high temperature epitaxially grown embedded strained layers 35 and 36 of eSiC and with in-situ doping for the source 37 and drain 38 by preferably arsenic (As), phosphorus (P), antimony (Sb) or the combination thereof, whose vertical profiles are shown in FIG. 13. This completes the specific description of the novel aspect of fabricating an integrated circuit device on a patterned SOI substrate and the remainder of the method for completing the CMOS device on an SOI substrate is conventional integrated circuit technology as is well known in the art.

Figure 15:
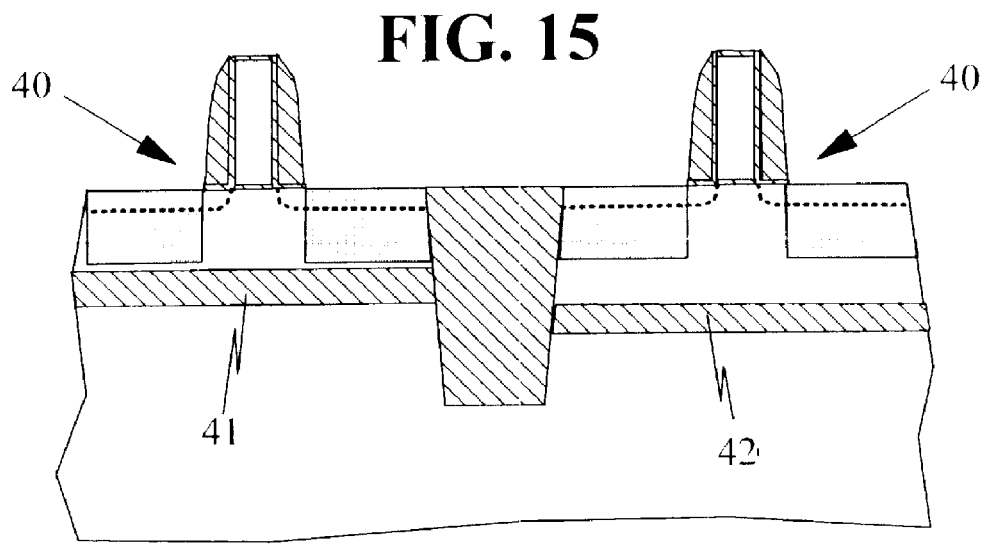
FIG. 15 is a cross-sectional view of a substrate of formed field effect transistors and with silicon on insulator (SOI) layers at different depths in the substrate and being of difference thickness.

Because the SOI substrate of the present invention can be fabricated any desired pattern and thickness under integrated circuit devices, this advantage will be emphasized by reference to FIG. 15. As shown, the field effect transistors 40 are meant to be generic to any integrated device and are carried on a SOI substrate whose SOI layer 41 can be at a shallow depth. If desired, the SOI layer can be deeper into the bulk silicon substrate as shown by SOI layer 42. In addition, the thickness of the SOI layer 42 can be formed thinner than the SOI layer 41

Although the invention has been shown and described with respect to certain embodiments, equivalent alterations and modifications will occur to those skilled in the art upon reading and understanding this specification and drawings. In doing so, those skilled in the art should realize that such alterations and modifications are within the spirit and scope of the present invention as set forth in the appended claims and equivalents thereon. Those skilled in the art also will understand that the semiconductor structure described by the present inventive technique will be part of a larger semiconductor device incorporating a large plurality of semiconductor devices. For example, the semiconductor structure could be part of a p-channel or n-channel MOSFET integrated circuit, or part of a CMOS which incorporates both p-channel and n-channel MOSFET integrated circuits which embody the present inventive techniques.

What is claimed is:

1. A method of fabricating a semiconductor transistor for an integrated circuit chip comprising the steps of:
   providing a bulk silicon substrate;
   forming at least one gate structure on the surface of said substrate;
   forming recesses in the bulk silicon substrate on both sides of said gate structure;
   forming an oxygen seed layer by implanting oxygen in said recesses, said oxygen seed layer being implanted into the recesses at tilt angles and with rotation to obtain a uniform layer completely under the gate and below the recesses; and
   converting the oxygen seed layer into silicon oxide by laser annealing the substrate for a predetermined time and temperature with the focus of the laser being at the recesses and on the implanted oxygen seed layer to convert the seed layer to a layer of buried silicon oxide (BOX), wherein said bulk silicon substrate is now capable of containing both SOI and bulk silicon devices.

2. The method of claim 1 wherein said recesses also are used to form strained source/drain layers for high performance FETs.

3. The method of claim 2 wherein said recesses are formed on both sides of the gate at variable silicon depths.

4. The method of claim 1 wherein the required BOX thickness and depth are obtained by varying the oxygen ion energy and dose and the laser annealing time and temperature.

5. The method of claim 1 wherein, after the conversion to the silicon oxide layer, the recesses are filled by selective epitaxial growth of an embedded strained layer.

6. The method of claim 5 wherein said epitaxial growth of the embedded strained layer provides in-situ doping for the source and drain of the transistor.

7. The method of claim 1 wherein the annealing temperature is in the range of from about 1100° C. to about 1300° C.

8. The method of claim 1 wherein the annealing time is in the range of about ten seconds to about ten minutes.

* * * * *